United States Patent [19]

Loper

[11] Patent Number: 5,179,730
[45] Date of Patent: Jan. 12, 1993

[54] SELECTIVITY SYSTEM FOR A DIRECT CONVERSION RECEIVER

[75] Inventor: Roger K. Loper, Marion, Iowa

[73] Assignee: Rockwell International Corporation, Seal Beach, Calif.

[21] Appl. No.: 498,075

[22] Filed: Mar. 23, 1990

[51] Int. Cl.$^5$ .......................... H04B 7/00; H04B 1/10
[52] U.S. Cl. .................... 455/266; 455/306; 455/324
[58] Field of Search ............... 455/324, 307, 306, 266, 455/314, 309; 329/303

[56] References Cited

U.S. PATENT DOCUMENTS

| | | | |
|---|---|---|---|
| 4,517,519 | 5/1985 | Mukaiyama | 327/303 |
| 4,570,125 | 2/1986 | Gibson | 455/324 |
| 4,893,316 | 1/1990 | Jane et al. | 455/324 |
| 5,052,050 | 9/1991 | Collier et al. | 455/324 |

Primary Examiner—Reinhard J. Eisenzopf
Assistant Examiner—Christine Belzer
Attorney, Agent, or Firm—John J. Horn; M. Lee Murrah; H. Fredrick Hamann

[57] ABSTRACT

A direct conversion receiver having a tri-phase architecture including three separate baseband signal channels. RF communications signals which are being tuned by the receiver are split into three equal and in-phase components which are mixed with three equal but substantially out-of-phase injection signals on frequency with the communications signal. The resulting baseband component signals are independently filtered and amplified on the three signal channels. The baseband components are then directed to a signal processing unit which corrects the baseband components for gain or phase mismatch errors between the signal channels based on the information carried by the three components and thereafter demodulates the signals in order to acquire the information carried by the RF communications signal. An automatic gain control system and a signal filtering system adapted for use with direct conversion receivers are also disclosed.

12 Claims, 4 Drawing Sheets

SELECTIVITY SYSTEM FOR A DIRECT CONVERSION RECEIVER

BACKGROUND OF THE INVENTION

The present invention relates to radio communications technology and more particularly to direct conversion receivers and the architectures of such receivers.

At the present time the vast majority of radio receivers are of the superheterodyne type employing one or more intermediate frequency stages which allow for filtering and amplification at fixed frequencies. Alternatives have always existed to the superheterodyne architecture such as superregenerative and direct conversion designs. However, these alternative designs has been subject to serious flaws which have relegated radio receivers of these types to specialty roles within the radio communications world.

Despite the widespread adoption of the superheterodyne design, it has been widely recognized that the direct conversion architecture holds great promise for superior performance. For example, direct conversion receivers are not subject to image rejection problems and are not affected by cross-over spurious responses which are so often the cause of interference and related design difficulties in superheterodyne receivers. Further, direct conversion receivers feature simpler low pass type filters operating at audio frequencies in contrast to the often bulky and expensive bandpass filters employed in superheterodyne receivers, require only a single injection signal at one frequency rather than multiple signals at different frequencies (multiple conversion sets), and provide a good potential for the VLSI implementations since a majority of the receiver components consist of active audio and digital circuitry.

Figure 1:
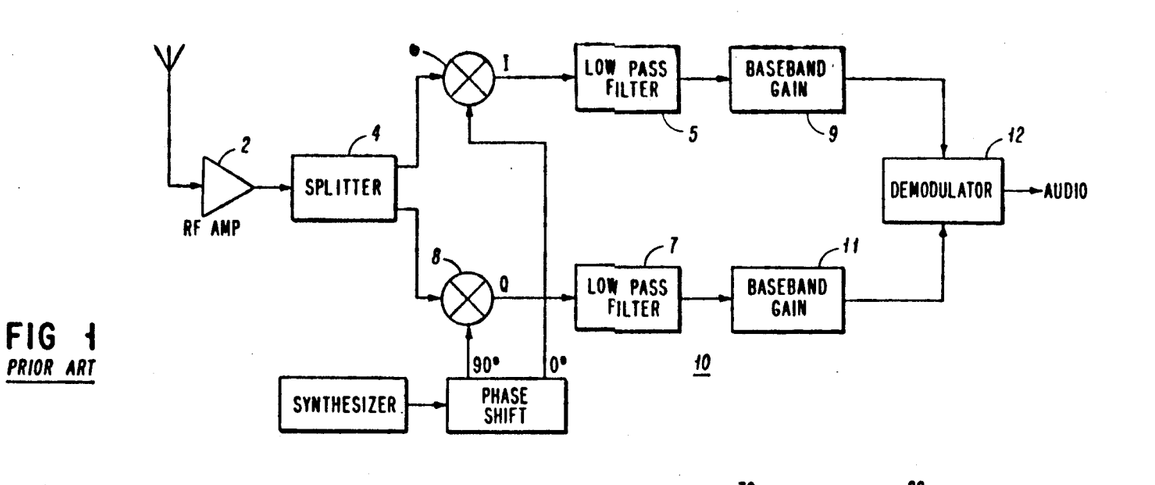
FIG. 1 provides an overall high level block diagram of a prior art type I/Q channel direct conversion receiver depicting the basic architecture of such receivers.

Referring now to FIG. 1, a prior art direct conversion receiver 10 would typically include an RF amplifier 2 and a splitter 4 for dividing an incoming RF communications signal into a pair of equal and inphase components. These RF components are mixed at the mixers 6 and 8 with separate injection signals on frequency with the communications signal but separated by 90° in phase. Inphase and quadrature baseband components are thereby formed which are independently filtered and amplified at audio frequencies on separate signal channels 3 and 5 by separate filters 5 and 7 and amplifiers 9 and 11. The inphase and quadrature (baseband) components formed as a result of the mixing process allow the signal to be conveniently and accurately demodulated upon being supplied to a suitable signal processing unit 12.

This architecture works well except that variations between the signal channels which commonly occur as a result of changes in temperature, frequency and other operational parameters result in gain and phase mismatches which produce distortion products in the output of the receiver. Gain mismatches of as little as 0.2 dB and phase mismatches of as little as 1° can result in 40 dB distortion products. While gain mismatches between signal channels can be reasonably controlled by careful selection of components, phase mismatches are much more difficult to regulate and constitute the primary design problem inherent in this architecture. The resulting distortion products can not ordinarily be reduced to less than 30–40 dB in practice and correspond to discrete tones which greatly limit the performance of the receiver. Researchers investigating the design of direct conversion radio receivers have frequently commented on this limitation, but none have heretofore been able to propose a practical method of overcoming gain and or phase errors arising within the direct conversion architecture.

It is, therefor, an object of the present invention to provide a direct conversion receiver of a new design which is characterized by superior performance due to the absence of distortion products arising from gain or phase mismatch errors between the signal channels in the receiver.

It is another object of the present invention to provide an architecture for a direct conversion receiver in which phase or gain errors between the signal channels within the receiver may be automatically corrected pursuant to simple signal processing algorithms.

It is a further object of the present invention to provide an automatic gain control system for use in conjunction with direct conversion receivers including those featuring the automatic correction of gain or phase errors between signal channels.

It is yet another object of the present invention to provide a signal filtering or selectivity system for use in conjunction with direct conversion receivers including those featuring automatic correction of gain or phase errors between signal channels.

It is a yet further object of the present invention to provide a new architecture for a direct conversion radio receiver which is economic to construct, provides superior performance and may be substantially implemented in VLSI.

SUMMARY

The present invention constitutes a direct conversion radio receiver having a new tri-phase or "triangular" architecture including three separate signal channels which enable hardware related phase or gain errors between the channels to be accurately corrected. Incoming RF communications signals are first split into three equal and inphase components which are directed along the separate signal channels. The RF signal components are supplied to mixers in which they are mixed with three separate out-of-phase injection signals on frequency with the RF communications signal. The baseband components produced as a result of the mixing processes are separately filtered and amplified along each of the signal channels whereby the gain and selectivity for the receiver are primarily provided. The baseband components are then supplied to a signal processing unit in which the information carried by these components is used to correct for gain or phase errors between the channels and the signal is demodulated to acquire the information carried by the original communications signal.

The preferred embodiment of the present invention further includes an RF amplifier for providing a limited amount of RF gain prior to the signal being split into RF components. The RF components are mixed with injection signals which are approximately 120° out-of-phase with each other in order to produce baseband components which should sum to zero in amplitude when the channels are identically matched. The baseband components are low pass filtered through the use of a specially adapted selectivity system featuring switched-capacitor filters which are accurately matched from channel to channel and allow for the audio bandwidth of the receiver to be readily adjusted.

Automatic gain control is provided through the use of multiplying DACS regulated in accordance with signal amplitude across all three baseband channels. The baseband signals are digitized using A to D converters and supplied to a digital signal processor for correction and demodulation. Correction of gain or phase errors is accomplished by detecting such errors between the signal channels based on phase calculations made using different pairs of components and correcting one or more of these components by the addition of component elements selected from the other components on the other channels. Two of the baseband components are then used to form a highly accurate quadrature component which may be utilized in combination with the inphase or reference component for demodulating the baseband signals.

DESCRIPTION OF THE PREFERRED EMBODIMENT

Figure 2:
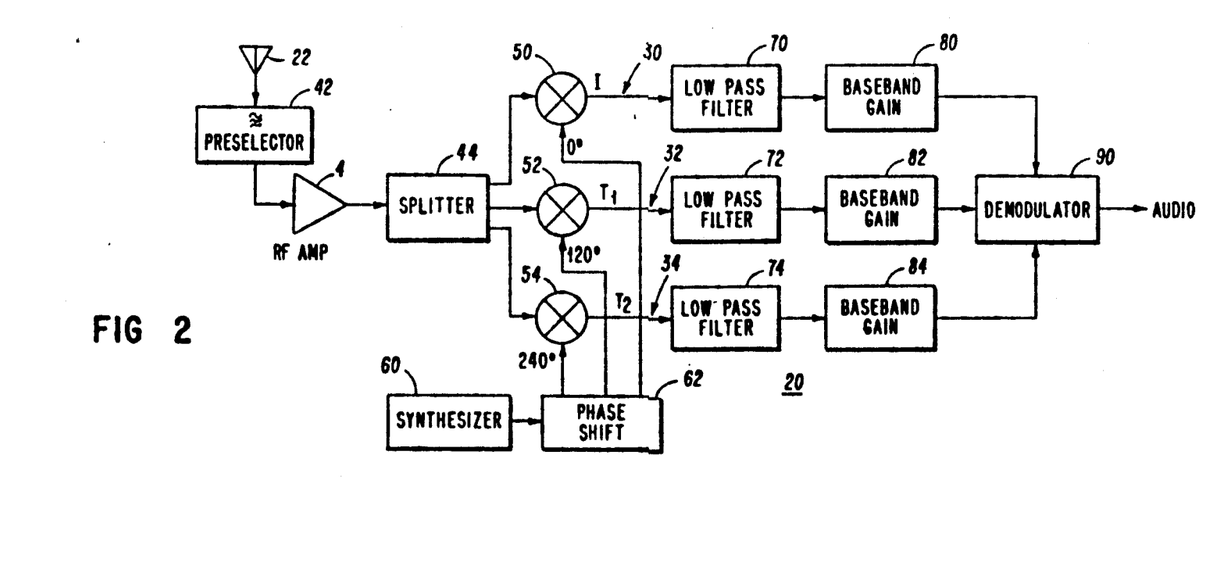
FIG. 2 provides an overall high level block diagram of a tri-phase direct conversion receiver in accordance with the present invention depicting the basic architecture of a tri-phase direct conversion receiver.

Referring now to FIG. 2, the basic structure is shown for a direct conversion radio receiver 20 constructed in accordance with the principles of the present invention. The receiver 20 is adapted for selecting among radio frequency ("RF") communications signals provided by the antenna 22 and amplifying a selected signal to power levels suitable for audio output. The radio receiver 20 is characterized by three channels 30, 32 and 34 along which substantially out-of-phase but otherwise similar signals are processed by the receiver.

Radio frequency communications signals provided by the antenna 22 are first amplified by the RF amplification stage 40 in order to elevate initial power levels and provide some gain outside audio frequencies. The RF amplification stage 40 may be associated with a RF preselector such as the preselector 42 providing a limited amount of RF filtering action useful in rejecting large and far off-channel signals. The RF communication signal from the RF amplification stage 40 is supplied to a splitter 44 which divides the RF signal into three equal amplitude and inphase components for processing by the three separate channels 30, 32 and 34 comprising the main section of the receiver 20. The three RF signals from the splitter 44 are supplied to the mixers 50, 52 and 54 where they are mixed with three separate injection signals. The injection signals have identically the same frequency but are substantially out-of-phase with one another (preferably by 120° but by at least as much as the largest phase error to be corrected; e.g. a 0-45-90 system would be satisfactory in most applications). The injection signals are generated by a frequency synthesizer 60 which produces a single injection signal at, or very nearly equal to, the frequency of the communications signal being tuned by the receiver and by the phase shifting filter network 62 which splits the injection signal into three equal but out-of-phase components. Since the injection signals are on frequency with the original RF communications signal, three baseband signal components I, $T_1$ and $T_2$ are produced as a result of the mixing process which are supplied down the channels 30, 32 and 34 to the low pass filter networks 70, 72 and 74 which are operative for providing the required selectivity for the receiver and are supplied to the baseband audio amplification stages 80, 82 and 84 which function to furnish most of the gain for the receiver 20.

The signals on the channels 30, 32 and 34 provided from the amplification stages 80, 82 and 84 are in turn supplied to a signal processing unit 90 adapted for correcting for hardware induced phase error between the signal channels and demodulating the signal components to acquire the information carried by the original RF communications signal. The signal processing unit 90 corrects for phase errors by detecting when the baseball signal components I, $T_1$ and $T_2$ on the signal channels 30, 32 and 34 are incorrectly phased with respect to one another and by modifying one or more of these signal components by addition of signal elements from the other signal channels proportionate in accordance with the phase error. Corrected baseband signal components from two of the signal channels are then used to construct an accurate quadrature signal component (Q) which may be utilized in combination with the third inphase (reference) component (I) to demodulate the signal components in accordance with conventional techniques for demodulation of signals represented by inphase and quadrature components.

The third signal channel included within the receiver of the present invention allows for the correction of gain and/or phase errors between the signal channels in a simple and accurate manner previously unknown in the art. This advance in the architecture of direct conversion receivers enables such receivers to provide superior performance equivalent to that achieved by triple and quadruple conversion superheteradyne receivers which are substantially more complex and more costly than receivers constructed in accordance with the principles of the present invention.

Figure 3:
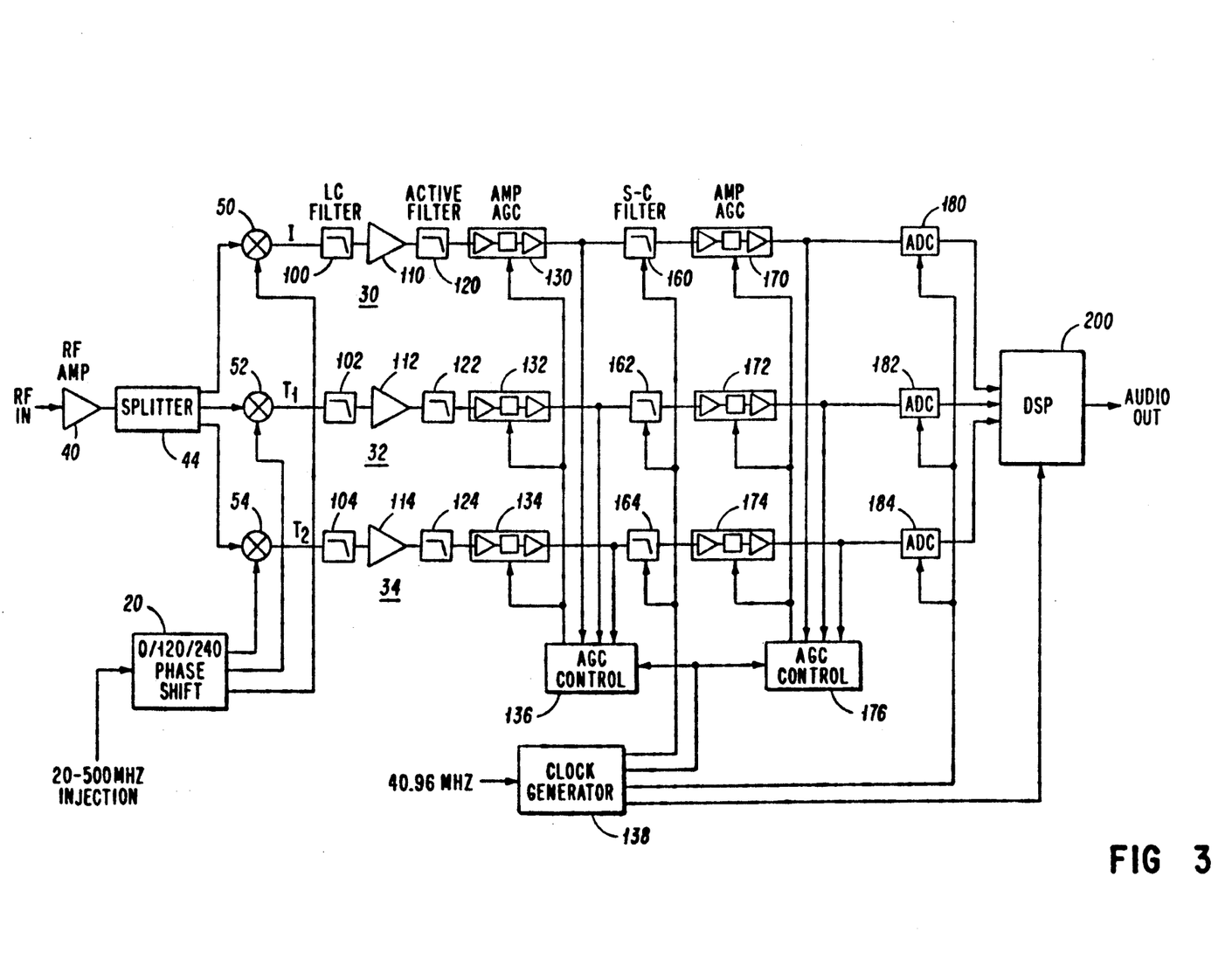
FIG. 3 provides a detailed block diagram of a tri-phase direct conversion receiver in accordance with the present invention illustrating the components comprising the receiver and their interconnections.

Referring now to FIG. 3, a more detailed structure is shown for a preferred embodiment of the present invention. RF communications signals received by the antenna 22 are supplied to the RF amplification stage 40 which may, for example, comprise a pair of integrated circuit amplifiers connected by a 50 ohm matching pad providing approximately 20 dB of RF gain. As indicated in FIG. 2, the RF amplification stage 40 may be preceded by a preselector such as a multichannel pin diode controlled filter adapted for helping to reject large far off-channel signals. The amplifiers RF comprising the amplification stage 40 should be selected to have good reverse isolation in order to help suppress the leakage of injection signal energy (from the mixers 50, 52 and 54) out to the antenna 22.

The amplified RF communications signal from the amplification stage 40 is supplied to a broadband splitter 44 such as a three way transformer network which divides the RF signal into three equal amplitude and inphase RF components. These RF components are separately directed along the signal channels 30, 32 and 34 and are independently processed on each of these channels. The RF components from the splitter 44 are first supplied to the mixers 50, 52 and 54 which preferably comprise matched double balanced diode mixers having good reverse isolation for additionally suppressing the leakage of injection energy out toward the antenna 22. The mixers are operative for separately mixing the equal and inphase RF components from the splitter 44 with three injection signals from the phase shift network 62 which are all on frequency with the RF communications signal being tuned by the receiver but are 120° out-of-phase with one another (i.e. the injection signals supplied to the mixers 52 and 54 are 120° and 240° out-of-phase with the signal supplied to the mixer 50, taking the signal provided to the mixer 50 as a reference at 0° phase). The injection signals may be generated utilizing a conventional indirect frequency synthesizer having multiple phase lock loops suitable for covering a range of frequency bands which supplies a single signal on frequency with a RF communications signal to the phase shift network 20. The phase shift network 20 would ordinarily comprise an all pass filter network including, for example, a number of differential bridged realizations of Chebyshev filters configured for providing 0°, 120° and 240° delay factors.

Since the injection signals are on frequency (i.e. at or nearly equal to) the frequency of the RF communications signal the mixers 50, 52 and 54 are functional for producing baseband signal components I, $T_1$ and $T_2$ at audio frequencies which reflect solely the modulation of the RF communications signal. The baseband signal components produced by the mixers 50, 52 and 54 are supplied to a set of three matched four pole low pass LC filters 100, 102 and 104 having corners ($-3$ dB cut-off frequencies) at approximately 750 kHz which independently operate on the signals from the different mixers and serve to suppress RF mixer products and large far off-frequency signals without significantly affecting the baseband signal components over the audio bandwidth of the receiver (10 kHz).

The baseband component output signals from the low pass filters 100, 102 and 104 are supplied to a set of three operational amplifiers 110, 112 and 114 which independently operate on the baseband components I, $T_1$ and $T_2$ and provide a moderate amount (approximately 20 dB) of initial audio gain on each of the channels 30, 32 and 34. The amplifiers 110, 112 and 114 are specially selected for providing good low noise performance since the signals proceeding from the low pass filters 100, 102 and 104 may be at low power levels.

The baseband component output signals from the amplifiers 110, 112 and 114 are supplied to a set of three matched four pole active filters having corners at 33 kHz which again operate independently on the baseband signal components. The filters 120, 122 and 124 may, for example, each comprise two series connected operational amplifiers configured as Sallen-Key filters, although many variations in design are possible so long as the filters used are well behaved and track each other closely over the audio bandwidth of the receiver (10 kHz) in order to avoid the generation of distortion products. The active filters 120, 122 and 124 are operative for rejecting any large near off-channel signals (i.e. 33 kHz + ) and thereby improving the selectivity of the receiver while helping to preserve its dynamic range in view of the characteristics of the switched capacitor filters which will be later described.

The baseband component output signals I, $T_1$ and $T_2$ from the active filters 120, 122 and 124 are supplied to a set of three controllable gain blocks 130, 132 and 134 which again operate independently on the different baseband signal components. The controllable gain blocks 130, 132 and 134 each include three operational amplifiers each providing approximately 20 dB of audio gain (60 dB total gain on each channel) and a multiplying DAC connected to an automatic gain control unit 136.

The automatic gain control ("AGC") functions of the present receiver are subject to some what different requirements when compared to the AGC functions of superheterodyne receivers. First, the AGC must track all three channels to avoid imbalances that relate to baseband component amplitude since, at a given time, any single channel may be going through 0 volts as a function of the signal phase. Therefore, a reference signal is generated by feeding samples of the I, $T_1$ and $T_2$ components on each of the three channels to a three phase full wave rectifier circuit. Second, AGC is required to function in the FM (and FSK) modes as well as in AM modes in order to preserve linear operation and avoid limiting as is usually done in a superheterodyne receiver. Limiting of FM signals should generally be avoided in direct conversion receivers since limiting is a form of sampling which may violate the Nyquist criteria for low modulation index signals because the sampling rate can fall below the information rate when sampling is not performed at an intermediate frequency well above the information bandwidth of the modulation. As a result, in order for a direct receiver to be frequency-agile and track signals which are rapidly hopping in frequency with short per bit "dwell" times (e.g. 40 microseconds), the AGC for a direct conversion receiver must have a very fast response time.

Figure 4:
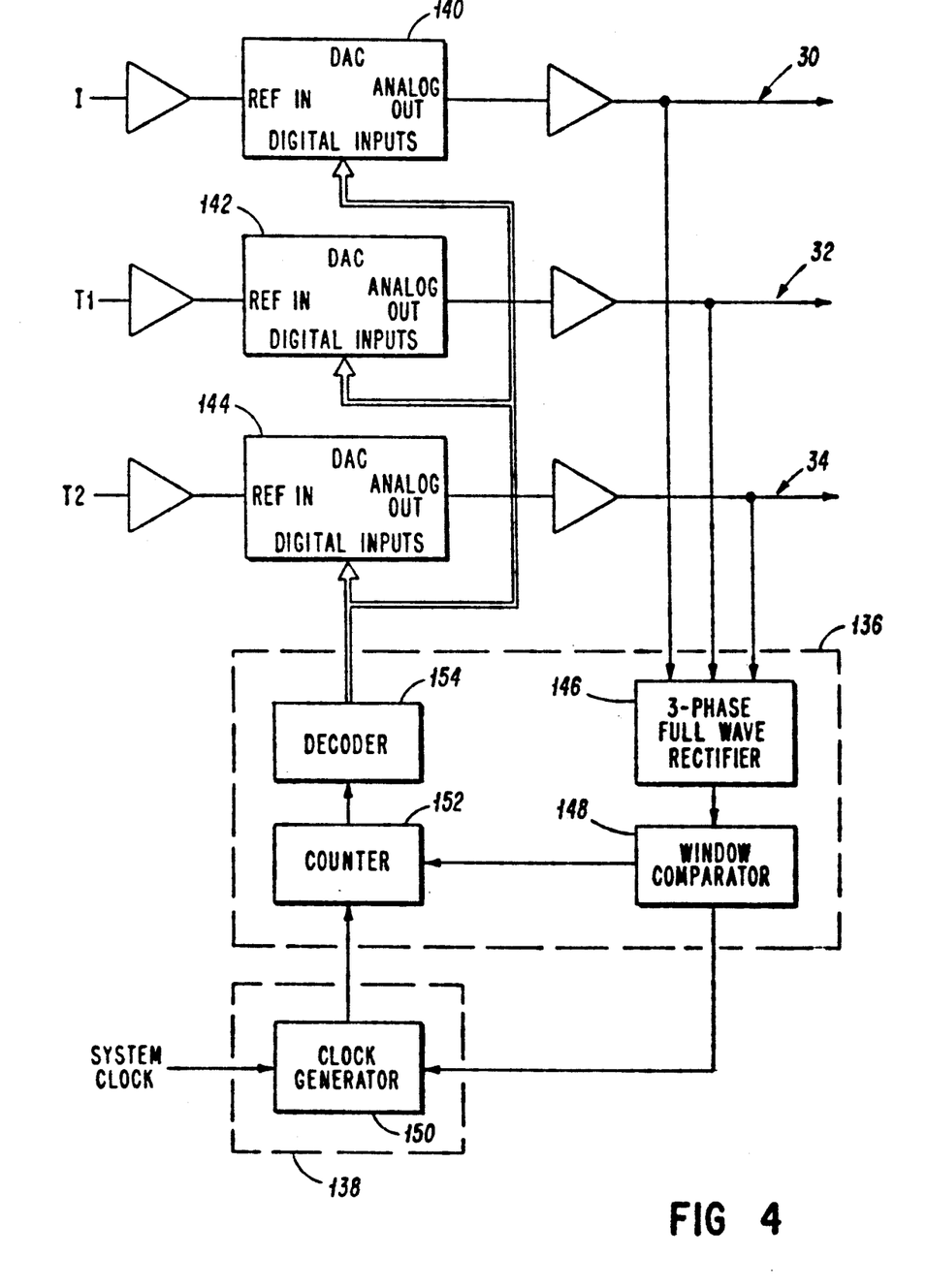
FIG. 4 provides a detailed block diagram of an automatic gain control system in accordance with the present invention which is specially adapted for use in conjunction with a direct conversion receiver.

Referring now to FIG. 4, a "localized" AGC loop is shown including a set of multiplying digital to analog converters ("DACs") 140, 142 and 144 installed in the signal channels 30, 32 and 34. Samples of the output signals from the gain control blocks 130, 132 and 134 on all three of the channels are directed to a three phase full wave diode rectifier 146 which generates a single signal having a voltage reflecting amplitude levels across all three channels. The output of the rectifier 146 is supplied to a window comparator and control unit 148 which classifies the voltage of the signal from the rectifier 146 as being either within, above or below a prescribed voltage "window" by comparison of the voltage with fixed thresholds. The window comparator and control unit 148 produces a set of control signals which indicate whether the voltage of the rectified signal from the rectifier 146 is either above, below or within the prescribed window. These signals are supplied to the clock generator 150 and controllable counter 152 for regulating their operation in accordance with the level of the rectified signal from the rectifier 146.

The clock generator 150 comprises a subunit of the system clock module 138 which also contains components for generating switched capacitor filter clock signal, the ADC sample and hold clock signal and the digital processor clock signal which will be referred to later. The clock generator 150 includes a number of dividers and associated digital circuitry for dividing down a high frequency system clock signal (e.g. 40 mHz) and supplying clock signals at different frequencies to the counter 152 in response to the control signals from the window comparator 148 whereby different attack and release rates are defined for the gain control function. For example, in the AM mode a clock signal may be provided to the counter 152 at 80 kHz for upcounting purposes (increasing attenuation) or at 15 Hz for downcounting purposes (decreasing attenuation) so that the automatic gain control function has both fast attack and slow release characteristics. In the FM mode a clock signal at 160 kHz may be provided to the counter 152 in order to allow for the gain control function to have both very fast attack and very fast release characteristics as required for frequency agility.

In response to the signals from the rectifier 146, the controllable counter 152 counts either up or down in binary at the rate determined by the clock signal provided by the clock generator 150. The count signal output of the counter 152 is supplied to a "binary to 1 of n" decoder 154 which translates the count information into a control signal comprising a digital word suitable for controlling the DACs 140, 142 and 144. The DACs 140, 142 and 144 are controlled as far as possible for attenuating the signal components I, $T_1$ and $T_2$ on the channels 30, 32 and 34 to exactly the same degree.

In constructing the automatic gain control circuitry described above, the voltage window for the window comparator 148 may, for example, be set at approximately 12 dB with the multiplying DACs 140, 142 and 144 set to adjust the gain in 6 dB steps allowing for 6 dB of hystersis. The DACs 140, 142 and 144 may accordingly be configured for providing zero to 54 dB of attenuation in nine distinct steps. Since the AGC loop is localized so as to include only a limited number of high bandwidth components capable of introducing only short delays into the loop and in particular is not closed around any filters which would introduce substantial delay, the response time of the AGC function is very fast. To be more specific, the AGC loop delay should be on the order of 3-5 microseconds so as to allow several gain control steps to be implemented before any information may be lost from signals having a 40 microsecond per bit dwell time.

Referring now again to FIG. 3, the baseband component output signals from the controllable gain blocks 130, 132 and 134 are supplied to a set of three carefully matched eight pole switched-capacitor filters 160, 162 and 164 which again independently operate on the baseband signal components I, $T_1$ and $T_2$. The filters 160, 162 and 164 are configured as low pass filters having corners at 10 kHz so as to define the audio bandwidth of the receiver at this frequency, although it should be noted that the bandwidth of the receiver may be set to different frequency ranges for different communications functions (e.g. analog voice, digital satellite, etc.). The filters 160, 162 and 164 are quasi-digital commutating filters which allow the audio bandwidth of the receiver to be conveniently adjusted to any of a number of frequency values (e.g. 3-30 kHz in 63 steps) appropriate for different communications purposes by changes to their clock signal frequencies. The switched-capacitor filters 160, 162 and 164 are carefully constructed to track each other closely and provide a high degree of differential gain and phase matching. Further, the corners of the filters 160, 162 and 164 may be accurately set to exactly the same frequency through the use of a single clock signal commonly supplied to these filters which may be generated by dividing down the system clock signal at the module 138. Therefore, the switched-capacitor filters 160, 162 and 164 provide excellent matching of phase and gain characteristics between the channels as required to ensure the spectral purity of the baseband components and avoid the generation of distortion products which might otherwise be produced in this key filtering step. However, since, the limited dynamic range (i.e. about 80 dB) they should be proceeded by sufficient gain to amplify weak signals above the noise level characteristic of these filters and by sufficient selectivity to preserve the dynamic range of the receiver as provided in the present case by the active filters 120, 122 and 124.

At this point the cooperative action of the LC filters, active filters and switched-capacitor filters in the embodiment shown for providing selectivity, dynamic range and distortion free output should be noted. The filters of each type making up the separate sets of LC, active and switched-capacitor filters are all matched by being carefully constructed using high precision components and are cornered at sufficiently high frequencies so as to help insure that the filters within each set track each other closely over the audio bandwidth of the receiver. On the other hand, the LC filters are cornered at a sufficiently low frequency so as to enable the rejection of RF mixer products and large far off-channel signals while the active filters are cornered at sufficiently low frequencies to enable the rejection of "near" off-channel signals. The switched-capacitor filters are cornered so as to adjustably define the audio bandwidth of the receiver and reject an off-channel signals proximate to this audio bandwidth. The relationships between the bandwidths of the different types of filters are important with the LC filters ordinarily having corners at frequencies 10-100 times the audio bandwidth of the receiver and the active filters ordinarily having corners at frequencies 1.2-5 times the audio bandwidth of the receiver and, therefore, in effect providing "broadband" and "semi-narrow" filtering action with the switched-capacitor filters providing "narrow" filtering action. In particular, the cooperative action between the active filters and switched capacitor filters is significant with the active filters serving to help preserve the dynamic range of the receiver with respect to large off-channel signals having frequencies beyond the corners of these filters.

The baseband component output signals from the switched-capacitor filters 160, 162 and 164 are separately supplied along the channels 30, 32 and 34 to another set of three controllable gain blocks 170, 172 and 174 which operate in coordination with another AGC control unit 176 in a manner fully consistent with the gain blocks 130, 132 and 134 and the AGC control unit 136 previously described. AGC control is again accomplished by regulating the variable attenuation provided by a set of multiplying DACs each of which is associated with operational amplifiers providing moderate amounts of gain.

The baseband component output signals from the controllable gain blocks 170, 172 and 174 are separately supplied along the channels 30, 32 and 34 to a set of analog-to-digital converters ("ADCs") 180, 182 and 184 which include sample and hold circuitry regulated for separately sampling each of the baseband signal components I, $T_1$ and $T_2$ in accordance with a common 90 kHz clock signal generated at the module 138 by dividing down the system clock signal. The (ADCs) 180, 182 and 184 each provide 12 bit parts of data output representing the amplitude of the baseband components on each of the separate channels 30, 32 and 34. The ADCs 180, 182 and 184 effectively convert the analog baseband components to digital word signals which can be processed by a digital signal processing module 200.

The digital signal processing unit 200 comprises a conventional digital signal processor such as a ADSP-2100 as manufactured by Analog Devices Corporation of Los Angeles, California which is clocked by the system clock signal to run at approximately 40 mHz in the current application. The signal processing unit 200 receives digital words representing the 11 amplitudes of the baseband signal components I, $T_1$ and $T_2$ on the channels 30, 32 and 34 from the ADCs 180, 182 and 184. In accordance with FIG. 5, the signal processing unit 200 processes this data on a real time basis in order to correct for phase errors between the signal channels and demodulate the signals in order to acquire the information carried by the original RF communications signal.

The conventional I/Q dual channel direct conversion receiver provides two pieces of information to its signal processing unit, namely, I channel data and Q channel data. In the absence of substantial differential gain or phase errors, these pieces of information are sufficient to allow the determination of two "unknowns", the amplitude and phase of the signal as required for demodulation. The data is however insufficient to allow for the determination of any further unknowns such as any gain and phase errors between the signal channels. If, however, as in the present invention a third signal channel is introduced for carrying a signal component out-of-phase with the signal components carried on the two other signal channels, an additional piece of information is provided which is sufficient to determine a further unknown which can be either the gain or phase imbalance between the signal channels. In this new tri-phase or "triangular" architecture the baseband signal components are preferentially separated by 120° in phase (i.e. 0°, 120° and 240°) so as to be symmetrically distributed in phase and thereby simplify the mathematics involved, although, such symmetry is not necessarily required.

When three 120° out-of-phase signal channels are employed it can be mathematically shown that for any input signal the three baseband components I, $T_1$ and $T_2$ must sum to zero in the absence of hardware imperfections. Therefore, if the sum of the baseband components $(I + T_1 + T_2)$ does not equal zero, it can be concluded that hardware gain and/or phase errors exist and a correction for either phase or gain errors should be generated. Because it is more difficult to control phase errors between the signal channels, they are usually the best choice for correction.

Figure 5:
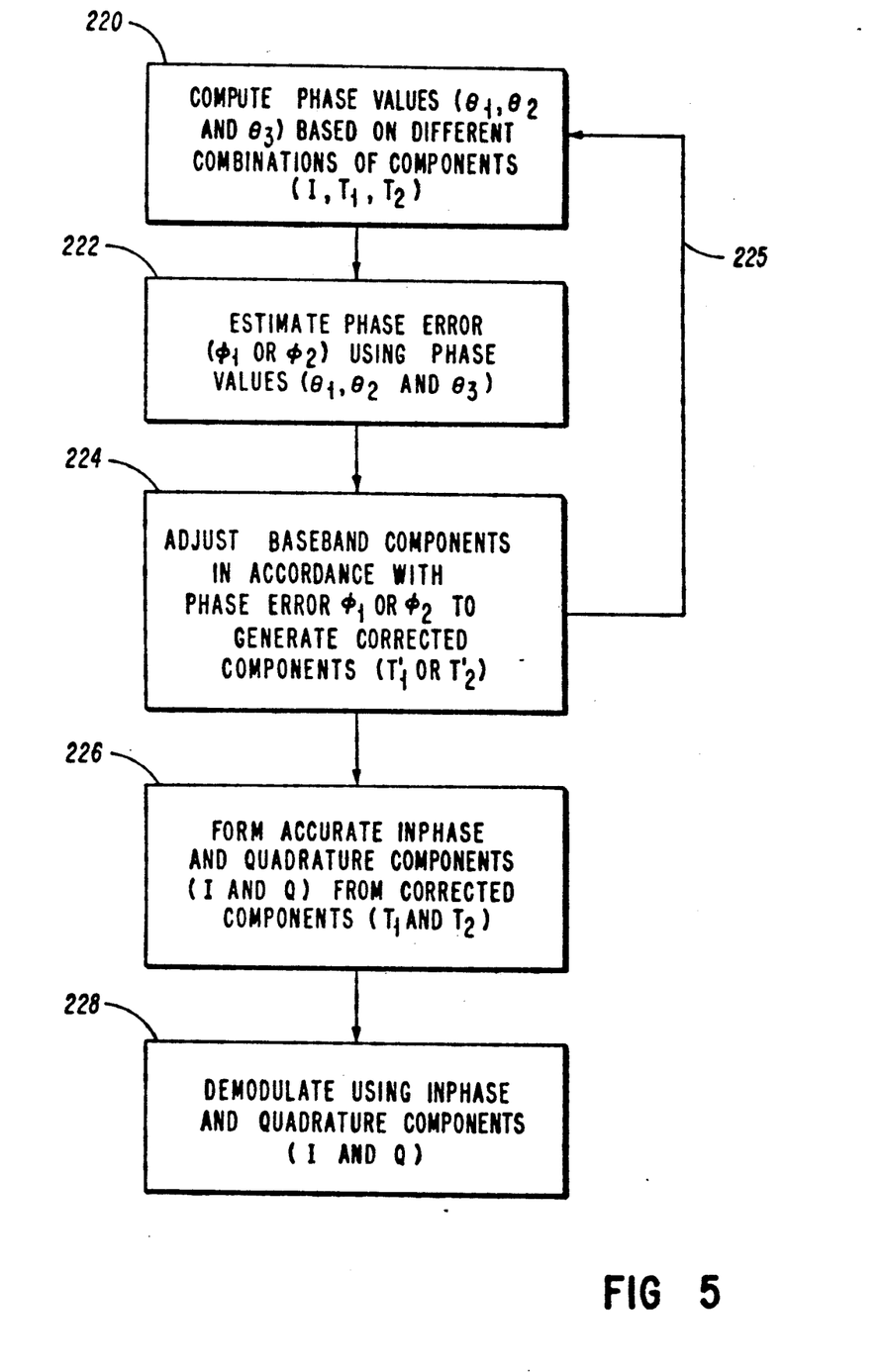
FIG. 5 provides a high level flow chart of the basic software routines performed by the digital signal processing unit of a tri-phase direct conversion receiver in accordance with the present invention.

Since it is possible to specify a signal with knowledge of any two of the three baseband components in a tri-phase receiver, the instantaneous phase of the signal can be calculated three different ways as per step 220 shown in FIG. 5 to produce three different representations $\theta_1$, $\theta_2$ and $\theta_3$ of the phase angle $\theta$ in accordance with the equations 1, 2 and 3 shown below.

$$\theta(T_1, T_2) = \theta_1 = \text{Tan}^{-1} \frac{T_2 - T_1}{\sqrt{3}(T_2 + T_1)} \quad (1)$$

$$\theta(I, T_1) = \theta_2 = \text{Tan}^{-1} \frac{I + 2T_1}{\sqrt{3} I} \quad (2)$$

$$\theta(I, T_2) = \theta_3 = \text{Tan}^{-1} \frac{I + 2T_2}{-\sqrt{3} I} \quad (3)$$

Whenever differences exist between the phase angles $\theta_1$, $\theta_2$ and $\theta_3$ a phase error exists. Based on the three values of the phase angle $\theta_1$, $\theta_2$ and $\theta_3$, simple algorithms may be constructed for estimating phase error. Taking one of the baseband signal components I as the reference, the phase of either of the other components $T_1$ or $T_2$ may be corrected depending on the phase angle of the signal and comparative magnitudes of $T_1$ and $T_2$. If the magnitude of baseband component $T_1$ is less than the magnitude of baseband component $T_2$, then the phase of the signal should be nearer to 30° or 210° than it is to 150° or 330° and, since the I baseband component is assumed to be the reference and any phase errors should be predominantly attributable to the $T_1$ baseband component due to the nature of trigonometric functions. Similarly, if the magnitude of baseband component $T_2$ is less than the magnitude of baseband component $T_1$ then the phase of the signal should be nearer to either 150° or 330° than 30° or 210° and any phase errors should be predominantly attributable to the $T_2$ baseband component due to the nature of trigonometric functions. Therefore, if the absolute value of $T_2$ is greater than the absolute value of $T_1$, an estimated phase error $\phi_1$, for the T1 channel may be calculated pursuant to step 222 in accordance with equation 4 below:

$$\phi_1 = \theta_3 - \frac{\theta_1 + \theta_2}{2} \quad (4)$$

If the absolute value of $T_1$ is greater than the absolute value of $T_2$, an estimated phase error, $\theta_2$, for the $T_2$ channel may be calculated pursuant to step 222 in accordance with equation 5 below:

$$\phi_2 = \theta_2 - \frac{\theta_1 + \theta_3}{2} \quad (5)$$

The phase corrections may be implemented by adding a little of the I baseband component to either the $T_1$ or $T_2$ baseband components depending on the apparent site of the phase error and adjusting the component amplitude to the resulting sum. Based on the phase errors calculated above, equations 6, 7, 8 and 9 below define the actual calculations used in step 224 by which adjusted baseband components $T_1'$ or $T_2'$ may be derived:

$$T_1' = k_1 T_1 + k_2 I, \text{ where} \quad (6)$$

$$k_1 = \frac{\sqrt{3}}{\sqrt{3} \cos(\phi_1) - \sin(\phi_1)}, \quad k_2 = \frac{2 k_1 \sin(\phi_1)}{\sqrt{3}} \quad (7)$$

$$T_2' = k_3 T_2 + k_4 I, \text{ where} \quad (8)$$

$$k_3 = \frac{\sqrt{3}}{\sqrt{3} \cos(\phi_2) + \sin(\phi_2)}, \quad k_4 = \frac{-2 k_3 \sin(\phi_2)}{\sqrt{3}} \quad (9)$$

It should be noted that initial samples of a signal may yield fairly crude approximations of the phase error, but each subsequent iteration of the algorithm around the loop defined by the return path 225 refines the values of the constants $k_1$, $k_2$, $k_3$ and $k_4$ which are automatically applied for correction of the baseband components before the phase angles and phase error are again estimated. As a consequence the values of the constants $k_1$, $k_2$, $k_3$ and $k_4$ rapidly converge as the algorithm is repeatedly executed. It should be noted that many variations exist in the algorithms which may be used to calculate the phase angle and phase error and in the procedures and associated algorithms which may be employed for correcting the baseband components. Nevertheless, the equations given above do define fairly simple expressions in which the functions can be readily expressed in terms of power series that are reasonably accurate over the range of expected values of the errors involved and which can be, conveniently translated into conventional digital processing routines for execution by the digital signal processing unit 200.

After the baseband components are phase corrected, the $T_1$ and $T_2$ baseband components are combined in step 226 in accordance with equation 10 below.

$$Q = \frac{T_1' - T_2'}{\sqrt{3}} \quad (10)$$

in order to generate a highly accurate Q quadrature component which is accurately 90° out-of-phase with the I baseband component Previously taken as a reference. The information may thereby be expressed in terms of inphase and quadrature components which can be readily demodulated pursuant to step 228 in accordance with conventional techniques. In the AM mode equation 11:

$$AM = \sqrt{I^2 + Q^2} \quad (11)$$

can be used to demodulate the signal and acquire the information carried by the original RF communications signal. In the FM mode, equation 12:

$$FM = \frac{d}{dt} \tan^{-1}(Q/I) \quad (12)$$

can be used to demodulate the signal and acquire the information carried by the original RF communications signal. These equations can be easily Programmed into routines for execution by the digital signal processing unit 200 in accordance with well known programming techniques.

In constructing the direct conversion radio receiver of the present invention certain notable design problems should be addressed in order to perfect a workable and efficient receiver. The various stages and components comprising the receiver may either be linked by being AC coupled or direct coupled. However, if the stages are AC coupled, the carrier signal may be lost in the AM mode when the injection signal is exactly on frequency with the RF carrier within the corner defined by the filtering action of the AC coupling components. This can result in substantial distortion in the final output signal. This problem can be resolved by using the FM demodulation algorithm (see equation 12) to indicate when the injection signal is very closely approaching the exact frequency of the carrier and providing for the frequency of the injection signal to be adjusted to be sufficiently off frequency with the RF carrier so as to be outside the range surrounding the carrier frequency defined by the AC coupling. DC coupling is generally preferable, but can also result in important problems due to the accumulation of DC offsets especially when used for coupling a series of stages having substantial amounts of gain as in the present invention. This problem may, however, be resolved by configuring the operational amplifiers providing the amplification along the channels 30, 32 and 34 so that their gain rolls off to unity at DC. This may be accomplished by providing feedback loops around the operational amplifiers having frequency dependent functions so that the impedance in the feedback path is greatly reduced at low frequencies whereby the gain of the amplifier is proportionately decreased.

The performance of the direct conversion radio receiver of the present invention can also be improved by taking account of the limitations in automatic gain control functions when presented with signals of very rapidly increasing amplitude. Since the AGC functions are frequently incapable of decreasing gain sufficiently rapidly to account for such signals the operational amplifiers and the amplification chain may be pushed up "on the rail" into saturation which is generally a undesirable condition for the receiver requiring a substantial recovery time. This situation can be ameliorated to some extent by providing an additional feedback path around the operational amplifiers in the channels 30, 32 and 34 in which back to back Zener diodes are connected between the inputs and outputs of the operational amplifiers. If these Zener diodes are chosen to have break down voltages above the desired operational range for the operational amplifier but below the saturation level they can effectively limit the voltage level between input and output and help to control "excursions" due to very rapidly rising signals.

While particular embodiments of the present invention have been shown and described, it should be clear that changes and modifications may be made to such embodiments without departing from the true scope and spirit of the invention. For example, the analog-to-digital interface may be moved "closer to the antenna" by eliminating the controllable gain blocks 170, 172 and 174 and the switched-capacitor filters 160, 162 and 164 and by having the functions (i.e. gain control and "narrow" filtering) performed by these components executed in using well known digital signal processing techniques. In particular, the switched-capacitor filters 160, 162 and 164 may be effectively replaced by low-pass digital finite impulse response ("FIR") filters which should have the advantage of being perfectly matched between the signal channels and being easily adjustable for setting and resetting corner of the filter defining the audio bandwidth of the receiver by means of changes to the weighting factors applied to the samples used by the filter algorithm. Expansion of the digital processing functions should result in a reduction in the numbers of chips and components and should lead to a decrease in audio gain problems associated with power and ground distribution, hum susceptibility and stability. However, the capabilities of, the ADCs 180, 182 and 184 and also the digital signal processor itself 200 might have to be significantly upgraded (e.g. ADCs 180, 184 may be required to have 14 or 16 bit parts of resolution) in order for them to handle their expanded roles. By way of a further example, the automatic gain control and selectivity systems disclosed in conjunction with the tri-phase receiver described above may also be usefully employed in direct conversion receivers having conventional type I/Q dual channel architectures. It is intended that the appended claims cover all such changes and modifications.

I claim:

1. A selectivity system for a direct conversion receiver including a plurality of baseband signal channels, comprising:
    a plurality of low-pass LC filters one of which is installed on each of said signal channels which are cornered at frequency 10–100 times greater than the audio bandwidth of the receiver and are constructed so that these filters track well over said bandwidth, said filters being operative for suppressing RF mixer products and far off-channel signals;
    a plurality of low-pass active filters one of which is installed on each of said signal channels following said LC filters which are cornered at a frequency 1.2–5 times greater than the audio bandwidth of the receiver and are constructed so that these filters track well over said bandwidth, said filters being operative for suppressing near off-channel signals and helping to preserve the dynamic range of the receiver; and
    a plurality of low-pass switched-capacitor filters one of which is installed on each of said signal channels following said active filters which are cornered so as to define the audio bandwidth of the receiver and are constructed so that these filters track well over said bandwidth, said filters being operative for suppressing all off-channel signals including any signals proximate to the audio bandwidth of the receiver.

2. The system of claim 1, wherein said LC filters are cornered at approximately 750 kHz, said active filters are cornered at approximately 33 kHz and said switched-capacitor filters are cornered at approximately 10 kHz.

3. The system of claim 1, wherein said LC filters are four pole filters, said active filters are approximately a four pole filters, and said switched-capacitor filters are eight pole filters.

4. The system of claim 1, further including means for adjusting the frequencies at which said switched-capacitor filters are cornered by changing a clock signal commonly supplied to these filters and thereby varying the audio bandwidth of the receiver.

5. In a direct conversion receiver including a plurality of baseband signal channels, the improvement comprising:
    a plurality of low-pass active filters one of which is installed on each of said signal channels and which are cornered at a frequency greater than the audio bandwidth of the receiver and are constructed so as to track each other closely over said bandwidth and suppress the greatest number of off-channel signals in order to help preserve the dynamic range of the receiver; and
    a plurality of low-pass switched-capacitor filters one of which is installed on each of said signal channels following said active filters and which are cornered so as to define the audio bandwidth of the receiver and suppress all off-channel signals including any signals proximate to the audio bandwidth of the receiver.

6. The improvement system of claim 5, further comprising:
    a plurality of low-pass LC filters cornered at a frequency greater than the audio bandwidth of the receiver and are constructed so as to track each other closely over said bandwidth and suppress RF mixer products and far off-channels signals.

7. The improvement of claim 5, further including means for adjusting the frequencies at which said switched-capacitor filters are cornered by changing a clock signal commonly supplied to these filters and thereby varying the audio bandwidth of the receiver.

8. The improvement of claim 5, wherein the frequencies at which said active filters are cornered is 1.2–5 times the audio bandwidth of the receiver.

9. The improvement system of claim 6, wherein said LC filter is cornered at approximately 750 kHz, said active filter is cornered at approximately 33 kHz and said switched-capacitor filter is cornered at approximately 10 kHz.

10. A process for filtering the baseband signals in a direct conversion receiver having a plurality of baseband signal channels, comprising the steps of:
    filtering said baseband signals using matched active low-pass filters cornered at a frequency 1.2–5 times the audio bandwidth of the receiver which are operational for substantially supressing off-channel signals and thereby helping to preserve the dynamic range of the receiver;
    filtering said baseband signals using matched quasi-digital or digital filters cornered so as to define the audio bandwidth of the receiver and which are operational for suppressing all off-channel signals including signals proximate to said bandwidth but which are characterized by limited dynamic range; and
    filtering said baseband signals using matched LC filters cornered at a frequency 10–100 times the audio bandwidth of the receiver which are operative for suppressing RF mixer products and off-channels signals;
    wherein said active filter is cornered at approximately 33 kHz and said quasi-digital or digital filter is cornered at approximately 10 kHz.

11. In a direct conversion receiver having a plurality of baseband signal channels carrying separate baseband signal components, the improvements comprising:
    digital signal processing means controlled in accordance with a real time low-pass filtering software program characterized by sample weighting factors for processing said baseband components and defining the audio bandwidth of the receiver;
    means for varying said audio bandwidth by adjusting said weighting factors in accordance with the operational mode of the receiver; and
    a plurality of active low-pass filters one of which is installed on each of said signal channels prior to said digital signal processing means and which are cornered at a frequency greater than said audio bandwidth and are operational for suppressing near off-channel signals.

12. The improvement of claim 11, further including:
    a plurality of low-pass LC filters one of which is installed on each of said signal channels prior to said active filters and which are cornered at a frequency greater than said audio bandwidth and are operational for suppressing RF mixer products.

* * * * *